United States Patent [19]

Schierz

[11] 4,079,410
[45] Mar. 14, 1978

[54] SEMICONDUCTOR RECTIFIER DEVICE WITH IMPROVED COOLING ARRANGEMENT

[75] Inventor: Winfried Schierz, Roth, Germany

[73] Assignee: Semikron Gesellschaft fur Gleichrichterbau und Elektronik m.b.H., Nuremberg, Germany

[21] Appl. No.: 744,603

[22] Filed: Nov. 24, 1976

[30] Foreign Application Priority Data

Dec. 10, 1975 Germany .............................. 3936561

[51] Int. Cl.² ..................... H01L 23/16; H01L 39/02; H01L 23/02
[52] U.S. Cl. ....................................... 357/82; 357/75; 357/81; 357/72; 174/16 HS; 165/80
[58] Field of Search ....................... 357/81, 82, 75, 72; 174/16 HS; 165/80, 105

[56] References Cited

U.S. PATENT DOCUMENTS

| | | | |
|---|---|---|---|
| 2,915,685 | 12/1959 | Diebold | 357/82 |
| 3,483,444 | 12/1969 | Parrish | 357/75 |
| 3,611,107 | 10/1971 | Ruckel | 357/75 |
| 3,694,699 | 9/1972 | Snyder et al. | 174/16 HS |
| 3,706,010 | 12/1972 | Laermer et al. | 174/16 HS |
| 3,716,759 | 2/1973 | Scace et al. | 357/75 |
| 3,763,402 | 10/1973 | Shore et al. | 357/81 |
| 3,918,084 | 11/1975 | Schierz | 357/82 |

FOREIGN PATENT DOCUMENTS

| | | | |
|---|---|---|---|
| 2,337,694 | 11/1974 | Germany | 357/82 |

*Primary Examiner*—Andrew J. James
*Attorney, Agent, or Firm*—Spencer & Kaye

[57] ABSTRACT

An improved semiconductor rectifier arrangement of the type in which two unencapsulated rectifier elements, each having at least one pn-junction, are each fastened, via respective metal contact discs and in a manner that insulates the rectifier elements electrically and provides good heat conductance, on a common cooling member provided with coolant passages in which each rectifier element is connected at its upper connecting terminal to another rectifier element via a current conductor fastened on the contact disc associated with the other rectifier element to form an antiparallel circuit, and in which the structure comprising the cooling member, the rectifier elements and the current conductors is embedded in an insulating mass. Each contact disc bearing a rectifier element is provided with a connecting member for connecting the rectifier arrangement with current conductors, and is fastened to a suitably metallized surface section of a wafer made of a thermally good conducting electrical insulating material. The cooling member is provided in the form of a plate and has in its interior, at least in the region of the contact discs, a plurality of interconnected coolant channels which are parallel to one another and to the contact surface of the contact discs and which are provided with connections for external coolant lines. The structure which is intended to be embedded in an insulating mass is disposed in a housing of insulating material which is provided with suitable openings for the passage of the connections for the cooling member as well as for the connecting members for the contact discs, and is embedded in a cast plastic mass.

10 Claims, 4 Drawing Figures

SEMICONDUCTOR RECTIFIER DEVICE WITH IMPROVED COOLING ARRANGEMENT

BACKGROUND OF THE INVENTION

The present invention relates to a semiconductor rectifier arrangement. More particularly the present invention relates to such a rectifier arrangement in which two unencapsulated rectifier elements, each having at least one pn-junction, are each fastened, via a respective metallic contact disc and in a manner that insulates the rectifier elements electrically and provides good heat conductance, on a common cooling member provided with means for the passage of a coolant, in which each rectifier element is connected at its upper connecting terminal to another rectifier element via a conductor member fastened on the contact disc of the other rectifier element to form an antiparallel circuit, and in which the structure including the cooling member, rectifier elements and current conducting members is embedded in an insulating mass.

It is known that controllable semiconductor devices called thyristors can be switched from the nonconducting to the conducting state at any desired time during the halfwave charging them in the forward direction by a pulse applied to their control electrode. Such controllable semiconductor devices thus constitute contactless switches. Due to this advantageous property and other known advantages, thyristors are increasingly used to switch and control high currents, for example in the welding art, e.g., in antiparallel circuits as so-called a.c. control elements.

In such known devices, disc-shaped thyristors are provided with cooling elements for liquid cooling which provide a space-saving structure and high current handling capability. The assembly of such arrangements is complicated, however, because the above-mentioned thyristor structures require a cooling element at each of the two contact surfaces in order to approximately uniformly dissipate the power loss heat to both sides, and because the cooling elements must be assembled so that they are electrically insulated against one another. The hoses provided for the inlet and outflow of the coolant, tap water is preferred for this purpose, between the cooling elements of such known arrangements have a considerable length due to the different potentials of the cooling elements and the not negligible conductance of the coolant. With an alternating terminal voltage of 500 $V_{eff}$, an operating temperature of the coolant of about 60° C, and with the requirement that the heat loss produced in the coolant acting as a parallel resistance in the hoses may be only a few Watt, the use of tap water results in a hose length between the cooling elements of about 50 cm.

Embodiments have now been proposed in which the housing part supporting an unencapsulated rectifier element is simultaneously designed as a cooling element so as to optimize the power loss heat dissipation and is provided with a channel in its interior for the passage of coolant so that the coolant is conducted past the rectifier element at the shortest possible distance. While this does improve the operating behavior of such rectifier arrangements, the drawbacks of the thus required long external coolant lines are still present.

Structures have also been proposed in which the cooling member carrying the rectifier elements is provided with a cavity in its interior serving as a channel for the passage of coolant, and the coolant channel is formed by recesses in a base or lid portion of the two-piece cooling member or by suitably arranged partitions in a hollow body cooling member. It has been proposed, inter alia, to provide the coolant channel in a massive ceramic cover member. However, tests have shown that heat dissipation in such structures is in no way optimum.

SUMMARY OF THE INVENTION

It is therefore the object of the present invention to provide a semiconductor rectifier arrangement of the above-mentioned type with a cooling member of such design that the cooling effect is substantially improved compared to known structures.

This is basically accomplished according to the present invention in that in a semiconductor rectifier arrangement of the type initially described, each contact disc bearing a rectifier element is fastened on a suitably metallized surface section of wafer made of a thermally good conducting electrical insulating material, the cooling member is provided in the form of a plate and is provided, at least in the area of the contact discs, with a number of inter-connected coolant channels which are parallel to one another and to the contact surface of the contact discs and which are connected with connecting means for external coolant lines; each of the contact discs is provided with a connecting member to connect the rectifier arrangement with current conductors; and the structure which is intended to be embedded in an insulating mass is disposed in a housing of insulating material provided with suitable openings for the passage of the connecting means for the cooling member and for the connecting members for the contact discs, and is embedded in a cast plastic mass.

DETAILED DESCRIPTION OF THE PREFERRED EMBODIMENTS

Figure 1:
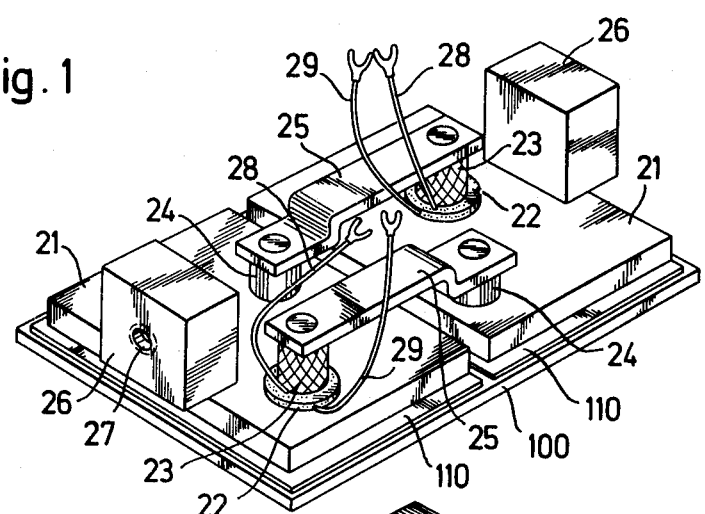
FIG. 1 is a perspective view of the significant components of an arrangement according to the invention in the form of an antiparallel connection of two thyristors and their mutual association but without the housing.

Referring now to the drawings wherein the same parts bear the same reference numerals in all figures, according to the embodiment of FIG. 1, the cooling member is a plate shaped body 1 of thermally good conducting material, e.g., copper, which is provided in its interior with coolant channels 2 which are parallel to one another and to the planar upper surface 6 of the plate 1, and hence to the contact surface of the contact discs 21 as will become clear from the description of same below. In the embodiment of FIG. 1 the channels 2 are blind bores which may be produced, for example, by drilling from a narrow edge surface 7 of the plate 1. Within cooling member or plate 1, the channels 2 pass at one end through a first transverse coolant channel 3 and at their other end they open into another likewise transverse coolant channel 3'. These transverse channels 3 and 3' interconnect the coolant channels 2 and may likewise be blind bores produced by drilling from an edge surface, e.g., the surface 8. The section of each of the coolant channels 2 disposed between the outer surface 7 and the first transverse channel 3 is sealed at the surface 7. In order to provide for the circulation of coolant through the channels 2, a connector 4, e.g. a connecting stud, is provided at each end of the cooling member 1 with one of the connectors 4 opening into the transverse coolant channel 3 and the other connector 4 (not shown) opening into the transverse coolant channel 3' for the inlet or outlet of a coolant.

As shown the connectors 4 are disposed on the lower surface of the plate 1, in which case the transverse coolant channels 3 are also sealed at the surface 8. It is to be understood, however, that if desired the connectors 4 could be disposed on another edge surface, e.g. on the edge surface 8.

The upper surface 6 of the cooling member 1 is planar and surface treated for the subsequent attachment of the rectifier elements. The expanse of this surface 6 is determined by the arrangement of the rectifier elements and the components required to connect them together electrically. The cross-section of the coolant channels 2 and 3 is determined by the quantity of coolant required to assure a constant temperature difference between the surface of the cooling member 1 bearing the rectifier elements and the associated surface around which the coolant flows. It is to be understood that the coolant channels 2 and 3 may have a cross section other than the circular cross section of the illustrated embodiment.

Instead of forming the cooling member 1 as described above, the cooling member 1 may also be produced according to the pressing or injection molding technique and may comprise two plate-shaped metal components which are each provided with a surface having the same number of identically designed and arranged, trough-shaped recesses and which are permanently and sealingly fastened together in a mirror image relationship so that the mating trough-shaped recesses form the coolant channels 2 and their transverse connections 3. As in the embodiment of FIG. 1, the connectors 4 for the external coolant connections open into the transverse connections 3.

In the embodiment according to FIG. 1, a wafer or thin plate 100 of a thermally good conducting electrical insulating material, preferably of oxide ceramic, is attached to the upper surface 6 of the cooling member 1 so that the cooling member or plate 1 can be used without electrical potential. The plate 100 of insulating material is provided with a thin layer of metal (not shown) on the surface intended for connection with the surface 6 of the cooling member 1 to facilitate attachments, e.g., by soldering, and is provided with two mutually spaced metallizations or metallized areas 110 on its upper surface which is intended for attachment of the rectifier elements. A pair of contact discs or plates 21 of an electrically and thermally good conducting material, e.g., copper, are fastened onto the wafer 100 by means of soldering same to the respective metallizations 110 with the discs 21 each having an areal expanse which corresponds to that of the associated metallization 110 so as to improve the thermal operating behavior of the entire arrangement. On these two contact discs 21 and with the use of the same as carrier plate as well as for the conduction of current, the antiparallel circuit including two rectifier elements of which at least one is preferably a controllable rectifier, is provided. In particular, mounted on each contact disc 21 is a rectifier element 22, which has its lower contact electrically and mechanically attached to the disc 21 by soldering and has a flexible upper conductor 23, and a metal contact bolt 24. In the case of a thyristor, as shown, each rectifier element is additionally provided with a control electrode terminal 29 and an auxiliary cathode terminal 28.

The areal expanse of each contact disc 21 depends on the contact surface of the rectifier wafer 22 and on that of the additionally attached contact bolt 24 and is not critical in view of the intended areal arrangement on cooling member 1. The areal expanse of cooling member 1 is consequently at least equal to that of the two contact discs 21 and the insulating spacing required between the two. The thickness of cooling member 1 is substantially determined by the cross section of coolant channels 2 and 3.

Each rectifier element 22 is permanently electrically connected, via its upper flexible conductor 23 and a respective metal contact bar 25, with the contact bolt 24 of the contact disc 21 associated with the other rectifier element. The contact bars 25 are each provided for this purpose with, for example, an opening for the passage of the conductor 23 and/or the contact bolt and are fastened to the contact bolt 24 and the conductor 23 by soldering. In order to obtain a suitable connection between conductor 23 and the contact bolt 24, the contact bars may be suitably bent as shown. Their design, attachment and expanse is not per se a part of the invention. Moreover, the spatial arrangement for the placement of the rectifier element 22 and the contact bolts 24 on the contact discs 21 is uncritical.

According to a feature of the invention, each contact disc 21 is provided with a metal connecting member 26 which is fastened on the contact disc or is a permanent part thereof at one of its free edges. As illustrated, the connecting member 26 has a block shape and is fastened on the surface of the contact disc 21 at the edge facing away from the adjacent contact disc 21 so that it extends beyond the edge of the disc surface. In order to permit a connection to an external current conductor preferably by means of a screw connection, a threaded bore 27 is provided in the protruding surface of the connecting member 26. The expanse of connecting member 26 is determined only by the given current handling capability of the rectifier arrangement.

Figure 2:
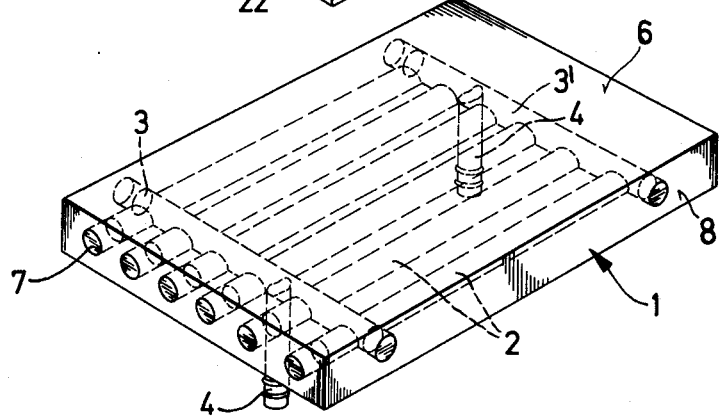
FIG. 2 is a perspective view of another embodiment of the cooling member of the semiconductor rectifier arrangement of the present invention.
Figure 2:
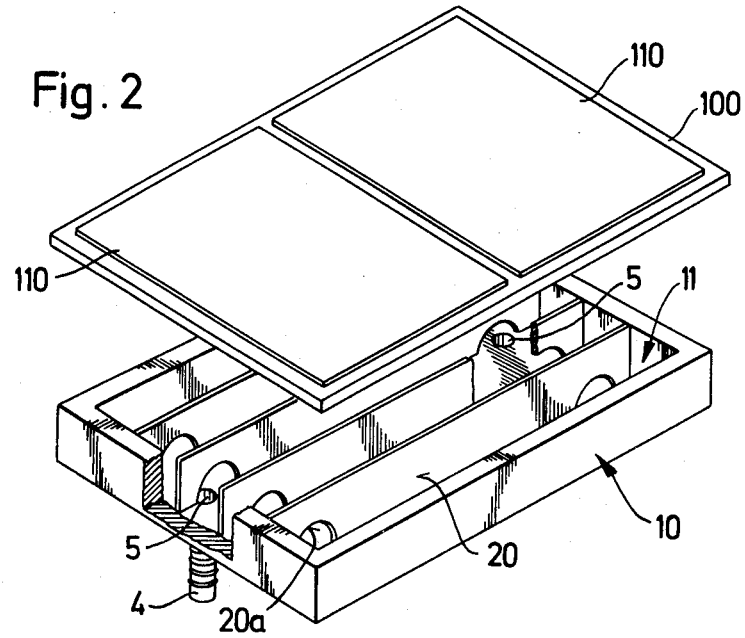

FIG. 2 shows another embodiment of the cooling member for use in an arrangement according to the invention. In this embodiment, the cooling member comprises a metal base plate 10 having a closed trough 11 formed in one surface. Within the trough 11 there are provided a plurality of bar-shaped partition elements 20 which are perpendicular to the bottom surface and are made of metal or plastic, which have dimensions which correspond to the inner dimensions of the base plate 10, and thus of the trough 11, and which are arranged to be mutually parallel and are spaced so as to form a plurality of coolant channels therebetween. These partition elements 20 are each further provided, at coinciding points adjacent each end when seen from the bottom surface of the base plate, with a recess or notch opening 20a. The openings 5 for providing communication between the coolant channels formed between the partitions 20 and connecting studs 4 open into the transverse connections of the coolant channels formed by the recesses 20a. The cover for the trough 11 and thus for the coolant channel arrangement is provided by the wafer or plate 100 of oxide ceramic which is fastened to the base plate 10, for example, by means of an adhesive and has a shape which matches that of the plate 10. The other parts of the rectifier arrangement shown in FIG. 1 are fastened to metallizations 110 of the cover member or wafer 100 in the same manner as described above with respect to FIG. 1.

Figure 3:
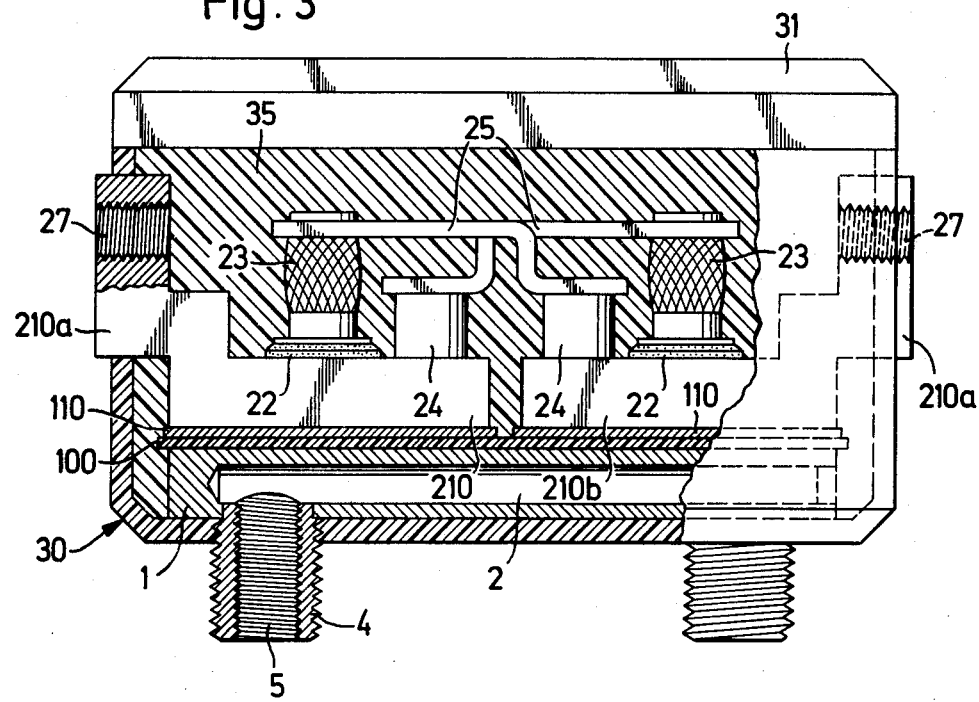
FIG. 3 is a cross-sectional view of the structure of FIG. 1 arranged in a housing but with a modification of the contact disc.

FIG. 3 is a partially sectional and partially front view of an arrangement according to the invention disposed in a housing 30 of insulating material. The housing 30 is provided with optimally adapted openings for the passage of the connecting member of the contact discs and for the coolant connections 4. The coolant connections 4 are provided in the form of connecting studs which protrude from the free underside of the housing 30. The insulating disc 100 is fastened on cooling member 1 and, via contact discs 210 the rectifier elements 22 are fastened on insulating wafer 100. The contact discs 210 include a planar carrier portion 210b, which essentially corresponds to the contact disc 21 of FIG. 1, as well as an integral extension 210a which is bent to form a connecting bar and is arranged to be perpendicular to the contact surface of disc portion 210b and to protrude from the housing 30, thus corresponding to member 26 of FIG. 1.

The structure, including cooling member 1, contact members 210, 24 and 25 and rectifier elements 22, is embedded in insulating material 35, preferably a plastic, e.g., an epoxy resin.

In order to prevent undesirable mechanical stresses on the semiconductor body of the rectifier elements 22 by the physical behavior of the casting mass during manufacture and during operation of the rectifier arrangement, the semiconductor body may additionally be accommodated in a cup-shaped metal member and connected therethrough with the corresponding contact disc 21 and be covered therein with silicone rubber.

In order to increase the mechanical stability of the housing 30, its lateral interior longitudinal surfaces in particular may be provided with reinforcing ribs.

The cover 31 provided to close housing 30 is also made of plastic and is preferably connected with the housing 30 by means of an adhesive. Both components are designed to have mutually adapted edge zones.

Figure 4:
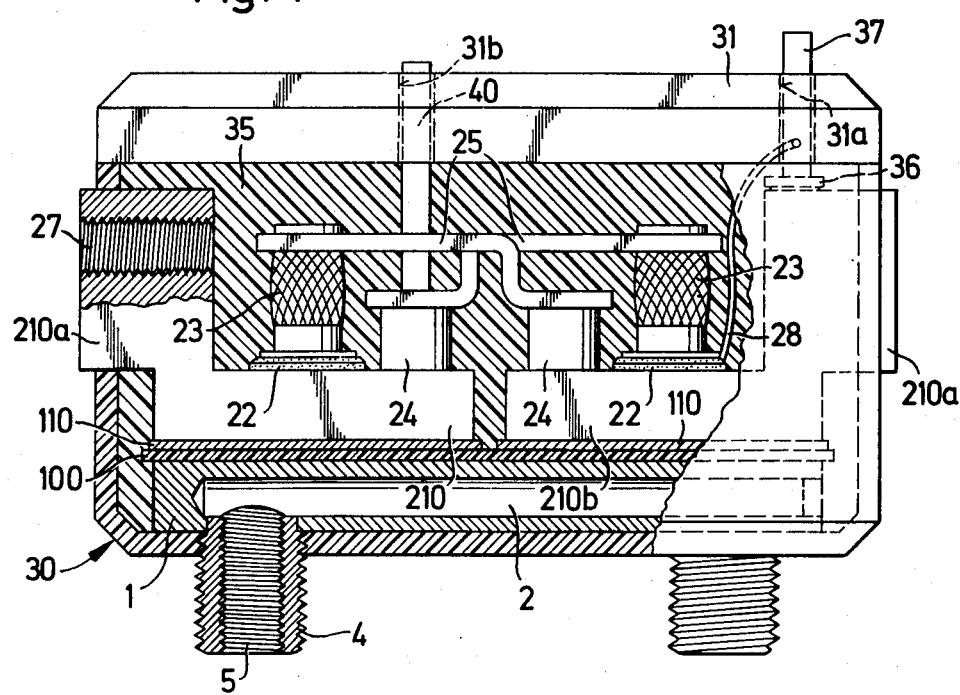
FIG. 4 is a cross-sectional view of the structure of FIG. 1, arranged in a housing according to FIG. 3, but with additional circuit members, which are passed through the cover of the housing.

When thyristors are used, their respective connection 28 and 29 for the control current and for the auxiliary cathode respectively are conducted and connected to additional appropriate connecting members on a circuit support which is fastened in electrical insulation on the associated connecting member 26, or 210a and said additional appropriate connecting members, which extend from these points or terminals through appropriate openings in the housing cover 31, are provided to permit connections to conductor members outside the housing. The circuit support is attached to the connecting member 26 or 210a, for example, by means of an adhesive. In FIG. 4 substantially according to FIG. 3 such a structure is illustrated. The control connection 28 is connected to the additional connecting member 37 of the circuit support 36, and the additional member extends through the opening 31a in the cover 31.

The housing cover 31 may be provided with further openings for the passage of temperature monitoring devices which are permanently connected with the circuit branches of the anti-parallel circuit including the rectifier element 22 and the current conductors.

Such a modification is shown in FIG. 4. On one of the two contact members 24 a mounting piece 40 is fastened. This piece 40 passes through the opening 31b of the housing cover 31 and is provided for the arrangement of a temperature monitoring device outside of the housing 31.

It will be understood that the above description of the present invention is susceptible to various modifications, changes and adaptations, and the same are intended to be comprehended within the meaning and range of equivalents of the appended claims.

What is claimed is:

1. In a semiconductor rectifier arrangement in which two unencapsulated rectifier elements, each having at least one pn-junction, are each fastened, via a respective metal contact disc electrically connected to the lower connecting terminal of the associated rectifier element and in a manner that insulates the rectifier elements electrically and provides good heat conductance, on a common cooling member provided with means for the passage of a coolant, in which each said rectifier element has its upper connecting terminal connected to the other of said two rectifier elements via a respective current conductor fastened on the contact disc associated with the other of said two rectifier elements to form an antiparallel circuit, and in which the structure including said cooling member, said two rectifier elements and said current conductors is embedded in an insulating mass; the improvement wherein:

each of said contact discs bearing one of said rectifier elements is fastened to a suitably metallized surface section of a wafer which is formed of a thermally well conducting electrical insulating material and which is fastened to said cooling member;

said cooling member is provided in the form of a plate which, at least in the region of said contact discs, is provided with a plurality of coolant channels in its interior which are parallel to one another and to the contact surface of said contact discs, are all connected together within the base plate at each of their respective ends and are provided with first and second connecting means for external coolant lines at their commonly connected said respective ends;

said contact discs are each provided with a respective connecting member for connecting the rectifier arrangement to external current conductors; and said structure which is intended to be embedded in an insulating mass is disposed in a housing of insulating material which is provided with suitable openings for the passage of said connecting means for said cooling member and for said connecting members for said contact discs, and is embedded in a cast plastic mass within said housing.

2. A semiconductor rectifier arrangement as defined in claim 1 wherein said cooling member is a metal component and said coolant channels are bores, having tightly sealed ends, which are formed in the interior of said plate and which are connected together by spaced transverse bores which are provided with respective openings for said coolant connecting means.

3. A semiconductor rectifier arrangement as defined in claim 1 wherein said cooling member comprises: a flat, metal plate having a closed trough formed in one surface thereof, a plurality of spaced, mutually parallel bar-shaped elements of an expanse adapted to the inner dimensions of said trough provided within said trough to form said plurality of coolant channels, a transverse opening formed at each end of each of said bar-shaped elements at coinciding points with each said opening extending from the surface defining the bottom of said trough, said transverse openings forming two transverse connections of the coolant channels in said trough, and a pair of openings which are formed in said metal plate and which open into the transverse connections of the coolant channels formed by said transverse openings for providing communication between said connecting means and said coolant channels; and wherein said wafer of insulating material is fastened to said one surface of said plate containing said trough and serves as a cover for said trough.

4. A semiconductor rectifier arrangement as defined in claim 1 wherein the surface of said wafer facing and connected to said cooling member is provided with a metal coating which promotes the connection therebetween.

5. A semiconductor rectifier arrangement as defined in claim 1 wherein said insulating material of said wafer is an oxide ceramic.

6. A semiconductor rectifier arrangement as defined in claim 1 wherein each of said connecting members for said contact discs is a separate component which is permanently electrically connected with the associated said contact disc and is arranged to protrude laterally beyond the edge of the associated said contact disc and out of said housing so as to provide a connection for current conductors outside of said housing.

7. A semiconductor rectifier arrangement as defined in claim 1 wherein each of said connecting members for said contact discs is a projection of the associated said contact disc, which projection extends laterally beyond the edge of the associated said contact disc in the form of a connecting bar and is arranged to appropriately protrude from said housing so as to provide a connection for current conductors outside of said housing.

8. A semiconductor rectifier arrangement as defined in claim 1 wherein each of said connecting members has the shape of a block or tongue and is provided with a threaded bore for connection to an external current conductor.

9. A semiconductor rectifier arrangement as defined in claim 1 wherein at least one of said rectifier elements is a controllable semiconductor rectifier element having at least one additional electrode for the control current; and further comprising means for providing electrical connections for any additional electrodes of said controllable rectifier element including a circuit support which is electrically insulatedly fastened on the associated said connecting member, electrical connecting means for connecting said additional electrode to a point on said circuit support and a connecting piece extending from said point on said circuit support through an opening in the cover of said housing to provide a connection outside of said housing.

10. A semiconductor rectifier arrangement as defined in claim 1 wherein the cover of said housing is provided with further openings for the passage of temperature monitoring devices which are permanently connected to the circuit branches of the antiparallel circuit including the rectifier element and current conductor members.

* * * * *

UNITED STATES PATENT AND TRADEMARK OFFICE
CERTIFICATE OF CORRECTION

PATENT NO. : 4,079,410
DATED : March 14, 1978
INVENTOR(S) : Winfried Schierz

It is certified that error appears in the above-identified patent and that said Letters Patent are hereby corrected as shown below:

In the heading of the patent, under [30] Foreign Application Priority Data, change "3936561" to -- 75 39 365 --.

Column 1, line 53, change "may" to --must--.

Signed and Sealed this

Fourteenth Day of August 1979

[SEAL]

Attest:

*Attesting Officer*

LUTRELLE F. PARKER
*Acting Commissioner of Patents and Trademarks*